(12) United States Patent
Liu

(10) Patent No.: US 9,336,841 B1
(45) Date of Patent: May 10, 2016

(54) PIPELINE REGISTER WITH DATA ALIGNMENT THEREIN

(71) Applicant: TAIWAN SEMICONDUCTOR MANUFACTURING CO., LTD., Hsinchu (TW)

(72) Inventor: Jack Liu, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/688,919

(22) Filed: Apr. 16, 2015

(51) Int. Cl.
G11C 5/00 (2006.01)
G11C 7/00 (2006.01)
G11C 7/22 (2006.01)
G11C 7/10 (2006.01)

(52) U.S. Cl.
CPC ........ *G11C 7/22* (2013.01); *G11C 7/106* (2013.01); *G11C 7/1087* (2013.01)

(58) Field of Classification Search
USPC .................. 365/52, 189.05, 189.17
See application file for complete search history.

(56) References Cited

U.S. PATENT DOCUMENTS

| | | | | |
|---|---|---|---|---|
| 5,953,257 A * | 9/1999 | Inoue | ............... | G11C 7/1006 365/189.05 |
| 7,242,635 B2 * | 7/2007 | Okuda | ............... | G06F 13/37 365/189.17 |
| 8,094,504 B2 * | 1/2012 | Smolka | ............... | G11C 5/00 365/189.05 |
| 8,525,567 B2 * | 9/2013 | Shibayama | ............... | G06F 9/3869 365/189.05 |

\* cited by examiner

*Primary Examiner* — Trong Phan
(74) *Attorney, Agent, or Firm* — Maschoff Brennan

(57) ABSTRACT

A device is disclosed that includes a first memory module and a second memory module. The first memory module is configured to output a data signal according to a first phase of a first control signal. The second memory module is connected to the first memory module and includes a latch and a derace latch. The latch is configured to hold a received data signal according to a second phase of a second control signal. The derace latch transmits the data signal from the first memory module to the latch according to the second phase of both of the first control signal and the second control signal.

20 Claims, 5 Drawing Sheets

PIPELINE REGISTER WITH DATA ALIGNMENT THEREIN

BACKGROUND

A pipeline register or a first-in-first-out (FIFO) memory device is a data storage device having a plurality of latches connected in series. The FIFO memory device allows data information to be written into data-storage locations at a write-data rate. The data is further sequentially transmitted through the memory device and is read out of the data-storage locations at a read-data rate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
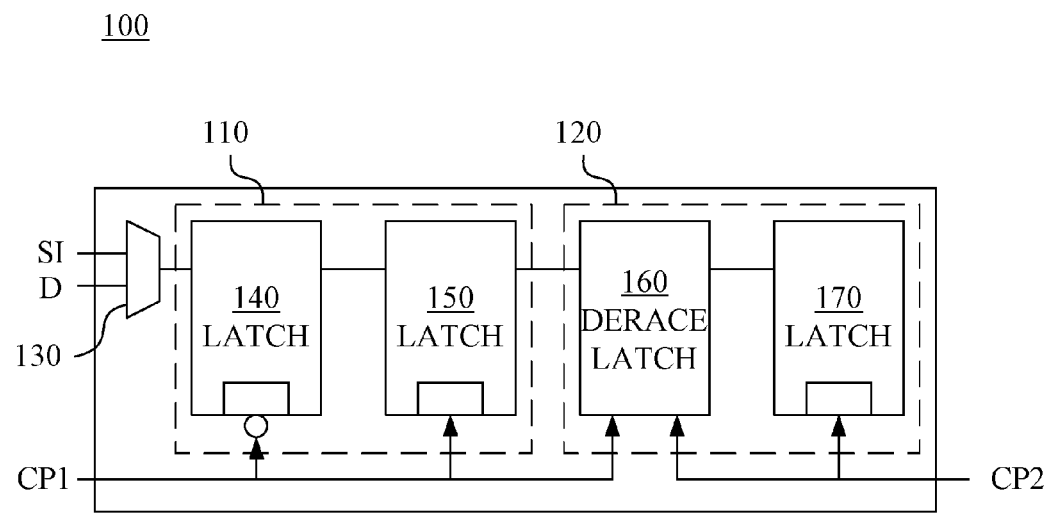
FIG. 1 is a block diagram of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

FIG. 1 is a block diagram of a memory device 100 in accordance with various embodiments of the present disclosure.

In some embodiments, the memory device 100 is a pipeline register for transmitting a data signal D or a scan-in signal SI sequentially. In some embodiments, the scan-in signal SI is transmitted in order to perform testing on the memory device 100. For illustration, the memory device 100 includes a memory module 110 and a memory module 120. The memory module 120 is connected to the memory module 110.

In some embodiments, the memory device 100 includes a multiplexer 130 connected to the memory module 110 to transmit either the data signal D or the scan-in signal SI. For illustration, the multiplexer 130 selects the data signal D and transmits the data signal D to the memory module 110 and subsequently to the memory module 120. In some embodiments, if the scan-in signal SI is selected by the multiplexer 130, the scan-in signal SI is transmitted in a manner similar to the data signal D, from the multiplexer 130 through the memory module 110 to the memory module 120.

In some embodiments, the memory module 110 is a flip-flop module or a latch module. The memory module 110 includes a latch 140 and a latch 150. The latch 140 and the latch 150 are configured to operate with a control signal CP1.

For illustration, the latch 140 and the latch 150 are connected in series. In operation, when the latch 140 receives the input signal, such as the data signal D, the latch 140 is configured to hold the input data signal D according to the control signal CP1 having a first phase. Further, the latch 140 is configured to output the input data signal D according to the control signal CP1 having a second phase.

In some embodiments, the first phase of the control signal CP1 is a high state phase and the second phase of the control signal CP1 is a low state phase.

Moreover, with the operation of the latch 140, the latch 150 is configured to receive and hold the input data signal D from the latch 140 according to the control signal CP1 having the second phase. Further, the latch 150 is configured to output the input data signal D according to the control signal CP1 having the first phase.

In some embodiments, the memory module 120 is a flip-flop module or a latch module. The memory module 120 includes a derace latch 160 and a latch 170. The latch 170 is configured to operate with a control signal CP2. The derace latch 160 is configured to operate with both of the control signal CP1 and the control signal CP2.

For illustration, the derace latch 160 is connected between the latch 150 and the latch 170 in series.

The derace latch 160 transmits the data signal to the latch 170 when both of the control signal CP1 and the control signal CP2 are in the second phase.

The latch 170 is configured to hold the data signal D transmitted from the derace latch 160 according to the control signal CP2 having the second phase. Further, the latch 170 is configured to output the data signal D according to the control signal CP2 having the first phase.

Figure 2:
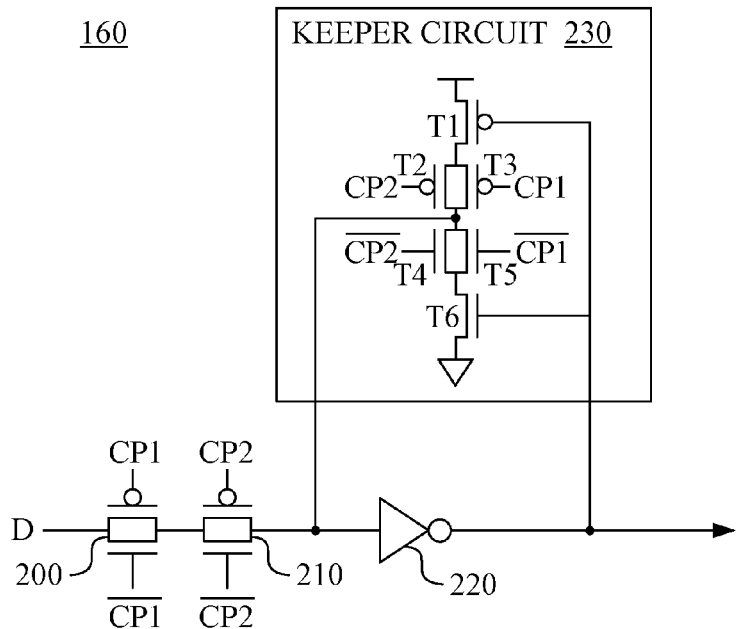
FIG. 2 is an illustrative circuit diagram of the derace latch in FIG. 1 in accordance with some embodiments of the present disclosure.

FIG. 2 is an illustrative circuit diagram of the derace latch 160 in FIG. 1 in accordance with various embodiments of the present disclosure.

With reference to FIG. 2, the derace latch 160 includes a transmission gate 200, a transmission gate 210, an inverter 220 and a keeper circuit 230.

Illustratively, the transmission gate 200 is connected to the latch 150 illustrated in FIG. 1. The transmission gate 210 is connected to the transmission gate 200 in series. The inverter 220 is connected between the transmission gate 210 and the latch 170 illustrated in FIG. 1. The keeper circuit 230 is connected between two ends of the inverter 220.

The transmission gate 200 is conducted according to the control signal CP1 having the second phase. The transmission gate 210 is conducted according to the control signal CP2 having the second phase. Accordingly, the data signal D is transmitted through the transmission gate 200 and the transmission gate 210 to the inverter 220. The inverter 220 then receives the data signal D and generates an inversion of the data signal D.

Detail circuits of the transmission gate 200 and the transmission gate 210 illustrated in FIG. 2 are given for illustrative purposes. Various circuits of the transmission gate 200 and the transmission gate 210 are within the contemplated scope of the present disclosure.

In some embodiments, an additional inverter (not illustrated) is added between the derace latch 160 and the latch 170 illustrated in FIG. 1. Accordingly, the additional inverter receives the inversion of the data signal D from the derace latch 160, and outputs the data signal D which is not inverted, to the latch 170.

As illustrated in FIG. 2, in some embodiments, the transmission gate 200 is controlled by the control signal CP1 and an inversion of the control signal CP1 (hereinafter /CP1), and the transmission gate 210 is controlled by the control signal CP2 and an inversion of the control signal CP2 (hereinafter /CP2). To pass the data signal D, the transmission gate 200 is enabled by the control signals CP1 and /CP1, and the transmission gate 210 is enabled by the control signals CP2 and /CP2.

For illustration, the second phase of the control signal CP1 and the control signal CP2 is the low state phase. The transmission gate 200 and the transmission gate 210 are enabled to pass the data signal D, according to the control signals CP1 and CP2. The inverter 220 then outputs the corresponding data signal D. The keeper circuit 230 is turned off according to the output of the inverter 220. Accordingly, the derace latch 160 outputs the corresponding data signal D when both of the control signal CP1 and the control signal CP2 are in the low state phase.

On the contrary, when either the control signal CP1 or the control signal CP2 is not in the low state phase, at least one of the transmission gate 200 and the transmission gate 210 is disabled. Accordingly, the keeper circuit 230 holds the data signal D corresponding to a previous cycle of the operation of the derace latch 160.

Alternatively stated, when either the control signal CP1 or the control signal CP2 is not in the low state phase, the derace latch 160 does not transmit a new data signal D transmitted from the latch 150 to the latch 170 illustrated in FIG. 1.

In some embodiments, as illustrated in FIG. 2, the keeper circuit 230 includes six transistors T1-T6. The transistors T2 and T3 are connected in parallel and further in series with the transistor T1. The transistors T4 and T5 are connected in parallel and further in series with the transistors T2 and T3, and further in series with the transistor T6. For illustration, the transistors T1 and T6 are controlled by the output of the inverter 220. The transistors T3 and T5 are controlled by the control signals CP1 and /CP1, respectively. The transistors T2 and T4 are controlled by the control signals CP2 and /CP2, respectively. In further embodiments, the transistors T1-T3 are p-type transistors, and the transistors T4-T6 are n-type transistors.

For illustration, in a condition that the transmission gate 200 is disabled with the control signal CP1 of the high state phase, and that the transmission gate 210 is enabled with the control signal CP2 of the low state phase, the data signal D inputted into the keeper circuit 230 and the inverter 220 is a low state signal. Under such condition, the inverter 220 outputs a high state signal according to the data signal D.

By the output of the inverter 220, the transistor T1 is turned off and the transistor T6 is turned on. Moreover, the transistors T3 and T5 are turned off by the control signals CP1 and /CP1, respectively, and the transistors T2 and T4 are turned on by the control signals CP2 and /CP2, respectively. Accordingly, the input of the inverter 220 is kept pulled low by the transistors T2 and T4. As a result, the data signal D at the input of the inverter 220 is maintained at the low state, which indicates that the keeper circuit 230 holds the data signal D.

Detail circuits of the keeper circuit 230 illustrated in FIG. 2 are given for illustrative purposes. Various circuits of the keeper circuit 230 are within the contemplated scope of the present disclosure.

Figure 3:
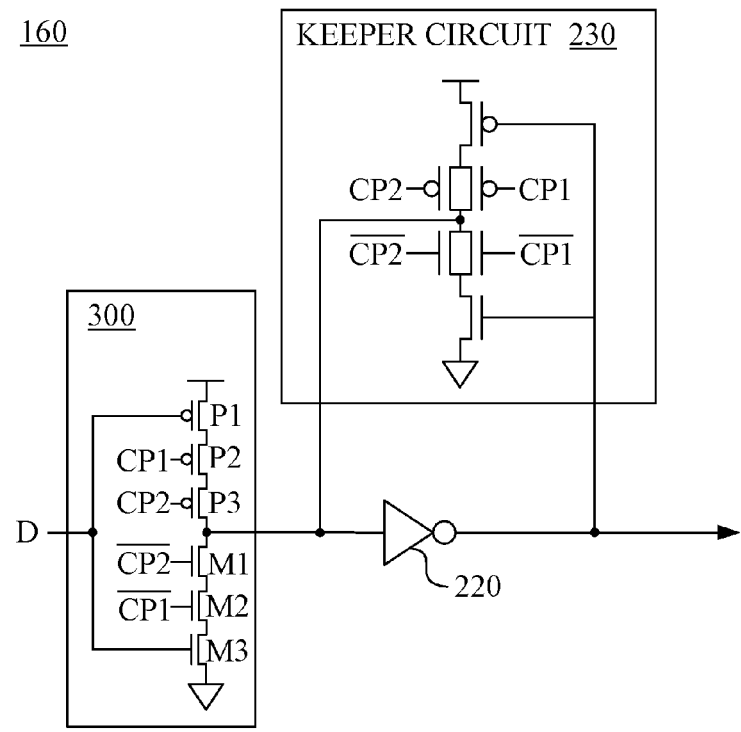
FIG. 3 is another illustrative circuit diagram of the derace latch in FIG. 1 in accordance with some other embodiments of the present disclosure.

FIG. 3 is another illustrative circuit diagram of the derace latch 160 in FIG. 1 in accordance with some other embodiments of the present disclosure. Compared to FIG. 2, the derace latch 160 in FIG. 3 includes a tri-state inverter 300 in replace of the transmission gate 200 and the transmission gate 210 in FIG. 2.

Illustratively, the tri-state inverter 300 is connected to the latch 150 in FIG. 1. The inverter 220 is connected between the tri-state inverter 300 and the latch 170 illustrated in FIG. 1.

The tri-state inverter 300 is conducted according to the control signal CP1 and the control signal CP2, both of which are of the low state phase. Accordingly, an inversion of the data signal D is transmitted through the tri-state inverter 300 to the inverter 220. The inverter 220 receives the inversion of the data signal D from the tri-state inverter 300, and further outputs the corresponding data signal D. Accordingly, the derace latch 160 transmits the data signal D when both of the control signal CP1 and the control signal CP2 are in the low state phase.

The circuits and operations of the inverter 220 and the keeper circuit 230 in FIG. 3 are similar to those illustrated in FIG. 2, and thus they are not further detailed herein.

In some embodiments, the tri-state inverter 300 includes six transistors P1-P3 and M1-M3. The transistors P1-P3 are connected in series. The transistors M1-M3 are connected in series. The transistors P1 and M3 are controlled by the data signal D. The transistors P2 and M2 are controlled by the control signals CP1 and /CP1, respectively. The transistors P3 and M1 are controlled by the control signals CP2 and /CP2, respectively. In further embodiments, the transistors P1-P3 are p-type transistors, and the transistors M1-M3 are n-type transistors.

For illustration, the control signal CP1 and the control signal CP2 both are in the low state phase, and the data signal D is a high state signal. Accordingly, the transistor P1 is turned off by the data signal D, and the transistor M3 is turned on by the data signal D. The transistors P2 and M2 are turned on by the control signals CP1 and /CP1, respectively. The transistors P3 and M1 are turned on by the control signals CP2 and /CP2, respectively. As a result, the tri-state inverter 300 outputs the inversion of the data signal D, which is a low state signal, due to the turn-off of the transistor P1 and the turn-on of the transistors M1-M3.

On the contrary, when either the control signal CP1 or the control signal CP2 is not in the low state phase, the tri-state inverter 300 is disabled. For illustration, when at least one of the control signal CP1 and the control signal CP2 is not in the low state phase, at least one of the transistors P1-P3 and at least one of the transistors M1-M3 are turned off, such that a new data signal D is not able to be transmitted through the tri-state inverter 300. Accordingly, the keeper circuit 230 holds the data signal D corresponding to a previous cycle of the operation of the derace latch 160, as discussed above.

Alternatively stated, when either the control signal CP1 or the control signal CP2 is not in the second phase, the derace latch 160 does not transmit a new data signal D transmitted from the latch 150 of the latch 170 illustrated in FIG. 1.

The pass gates 200 and 210 illustrated in FIG. 2 and the tri-state inverter 300 illustrated in FIG. 3 are given for illustrative purposes. Various circuits in replace of the pass gates 200 and 210 and the tri-state inverter 300 to pass the data signal D are within the contemplated scope of the present disclosure.

Figure 4A:
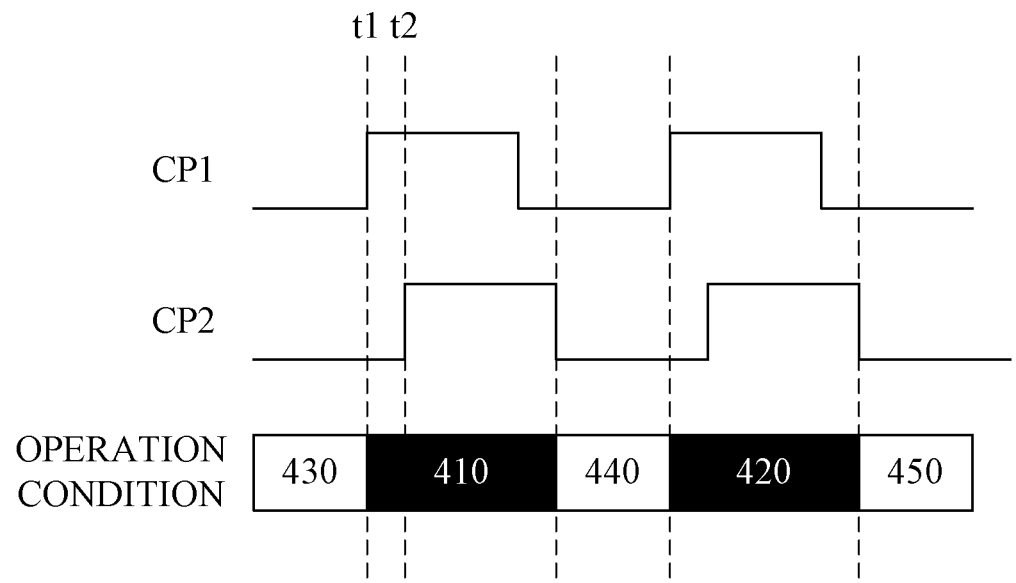
FIG. 4A is a diagram of waveforms of the control signals and the operation condition of the derace latch illustrated in either FIG. 2 or FIG. 3, in accordance with some embodiments of the present disclosure.

FIG. 4A is a diagram of waveforms of the control signals CP1 and CP2 and the operation condition of the derace latch 160 in FIG. 1, in accordance with some embodiments of the present disclosure. The operation of the derace latch 160 in FIG. 1 is described below with reference to FIG. 4A.

In FIG. 4A, the waveform of the control signal CP1 leads the waveform of the control signal CP2. For illustration, time t1 corresponds to the rising edge of the control signal CP1, while time t2 corresponds to the rising edge of the control signal CP2. It is indicated that time t1 is earlier than time t2, and thus the waveform of the control signal CP1 leads the waveform of the control signal CP2.

For illustration, the derace latch 160 is enabled when both of the control signal CP1 and the control signal CP2 are in the low state phase. The time period during which the derace latch 160 is enabled is illustrated as white blocks 430, 440 and 450. Accordingly, the enabled derace latch 160 transmits the data signal D from the memory module 110 to the latch 170.

On the other hand, the derace latch 160 is disabled when either one of the control signal CP1 or the control signal CP2 is not in the low state phase, e.g., in the high state phase. The time period during which the derace latch 160 is disabled is illustrated as black blocks 410 and 420. Accordingly, the disabled derace latch 160 stops transmitting the data signal D from the memory module 110 to the latch 170.

With reference to FIG. 1, in other approaches, the memory module 120 includes a latch identical to the latch 140 instead of the derace latch 160, in which such a latch is configured to operate with the control signal CP2. Under such a condition, the data signal D is outputted by the latch 150 prior to the conduction of such a latch. Accordingly, the latch 170 cannot receive the data signal D through such latch when the latch 150 outputs the data signal D. As a result, the transmission of the data signal D is thus not aligned with the reception of the latch 170.

Compared to the approaches discussed above, by employing the derace latch 160 illustrated in the present disclosure, the latch 170 is allowed to receive the data signal D through the derace latch 160 from the memory module 110 when the control signals CP1 and CP2 corresponding to the memory modules 110 and 120, respectively, are both in a same phase. Accordingly, the memory module 110 transmitting the data signal D is able to align with the memory module 120 receiving the data signal D. As a result, the memory module 120 does not miss the data signal D, compared to other approaches discussed above.

Figure 4B:
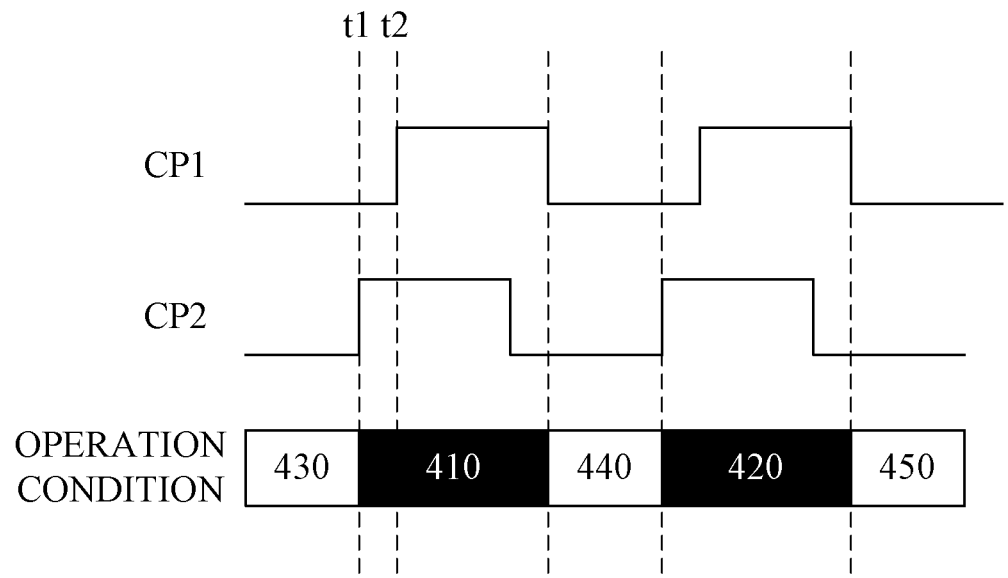
FIG. 4B is another diagram of waveforms of the control signals and the operation condition of the derace latch illustrated in either FIG. 2 or FIG. 3, in accordance with some other embodiments of the present disclosure.

FIG. 4B is another diagram of waveforms of the control signals CP1 and CP2 and the operation condition of the derace latch 160 in FIG. 1, in accordance with some other embodiments of the present disclosure.

Compared to FIG. 4A, the waveform of the control signal CP1 lags the waveform of the control signal CP2 in FIG. 4B. For illustration, time t1 corresponds to the rising edge of the control signal CP2, while time t2 corresponds to the rising edge of the control signal CP1. It is indicated that time t1 is earlier than time t2, and thus the waveform of the control signal CP1 lags the waveform of the control signal CP2.

For illustration, the derace latch 160 is enabled when both of the control signal CP1 and the control signal CP2 are in the low state phase. The time period during which the derace latch 160 is enabled is illustrated as white blocks 430, 440 and 450. Accordingly, the enabled derace latch 160 transmits the data signal D from the memory module 110 to the latch 170.

On the other hand, the derace latch 160 is disabled when either one of the control signal CP1 or the control signal CP2 is not in the low state phase. The time period during which the derace latch 160 is disabled is illustrated as black blocks 410 and 420. Accordingly, the disabled derace latch 160 stops transmitting the data signal D from the memory module 110 to the latch 170.

With reference to FIG. 1, in other approaches, the memory module 120 includes a latch identical to the latch 140 instead of the derace latch 160, in which such a latch is configured to operate with the control signal CP2. Under such a condition, the data signal D is outputted by the latch 150 after the conduction of such a latch. Accordingly, the latch 170 receives wrong data signal D through such latch when the latch 150 outputs the data signal D. As a result, the transmission of the data signal D is thus not aligned with the reception of the latch 170.

Compared to the approaches discussed above, by employing the derace latch 160 illustrated in the present disclosure, the latch 170 is allowed to receive the data signal D through the derace latch 160 from the memory module 110 when the control signals CP1 and CP2 are both in a same phase. Accordingly, the memory module 110 transmitting the data signal D is able to align with the memory module 120 receiving the data signal D. As a result, the memory module 120 is able to receive the required data signal D, compared to other approaches discussed above.

In other approaches, not only the memory module 120 includes a latch identical to the latch 140 instead of the derace latch 160, but also a hold buffer is inserted between the memory module 110 and the memory module 120 to accomplish the data alignment mechanism. Compared to the approaches discussed above, by employing the derace latch 160 illustrated in the present disclosure, the memory module 120 has a smaller area, consumes less power and uses less routing resource because no additional hold buffer is required.

Figure 5:
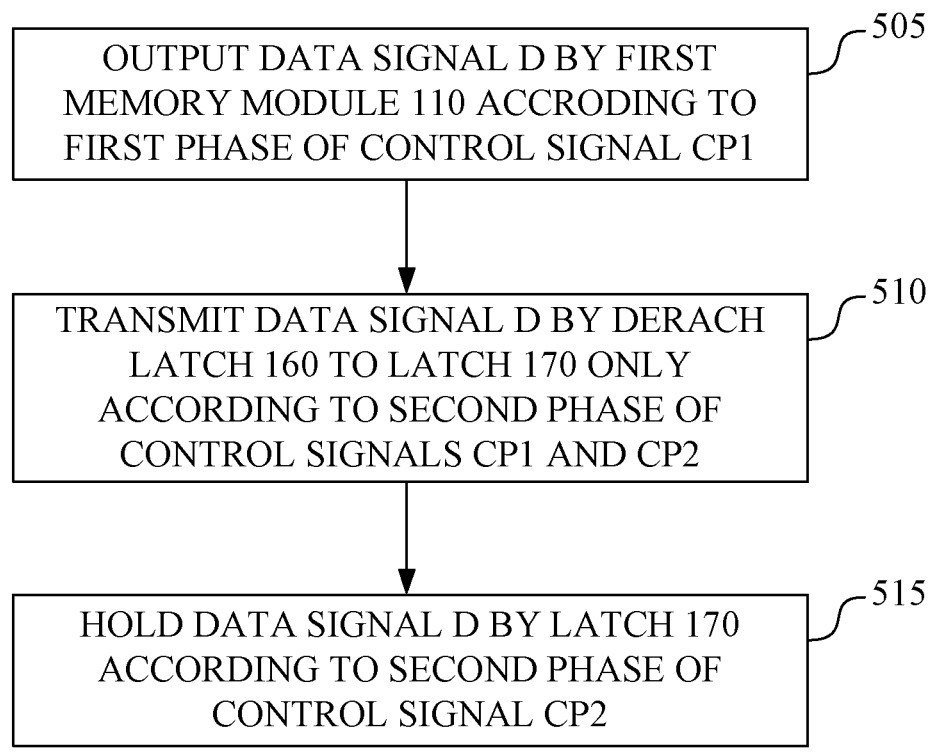
FIG. 5 is a flow chart of a method illustrating the operation of the memory device illustrated in FIG. 1, in accordance with some embodiments of the present disclosure.

FIG. 5 is a flow chart of a method 500 illustrating the operation of the memory device 100 in FIG. 1, in accordance with some embodiments of the present disclosure.

With reference to the method 500 in FIG. 5 and the memory device 100 in FIG. 1, in operation 505, the data signal D is outputted by the memory module 110 according to the first phase of the control signal CP1. For illustration, the data signal D is passed through the latch 140 and the latch 150 and outputted to the derace latch 160, when the control signal CP1 is in the high state phase as illustrated in FIG. 4A or FIG. 4B.

In operation 510, the data signal D is transmitted by the derace latch 160 to the latch 170 according to the second phase of both of the control signal CP1 and the control signal CP2. For illustration, the data signal D is passed through the derace latch 160 and outputted to the latch 170, when the control signals CP1 and CP2 are in the low state phase as illustrated in FIG. 4A or FIG. 4B.

In operation 515, the data signal D is held by the latch 170 according to the second phase of the control signal CP2. Further, the data signal D is then outputted by the latch 170 to another memory device or other functional circuits, for illustration, when the control signal CP2 transits from the low state phase to the high state phase.

Figure 6:
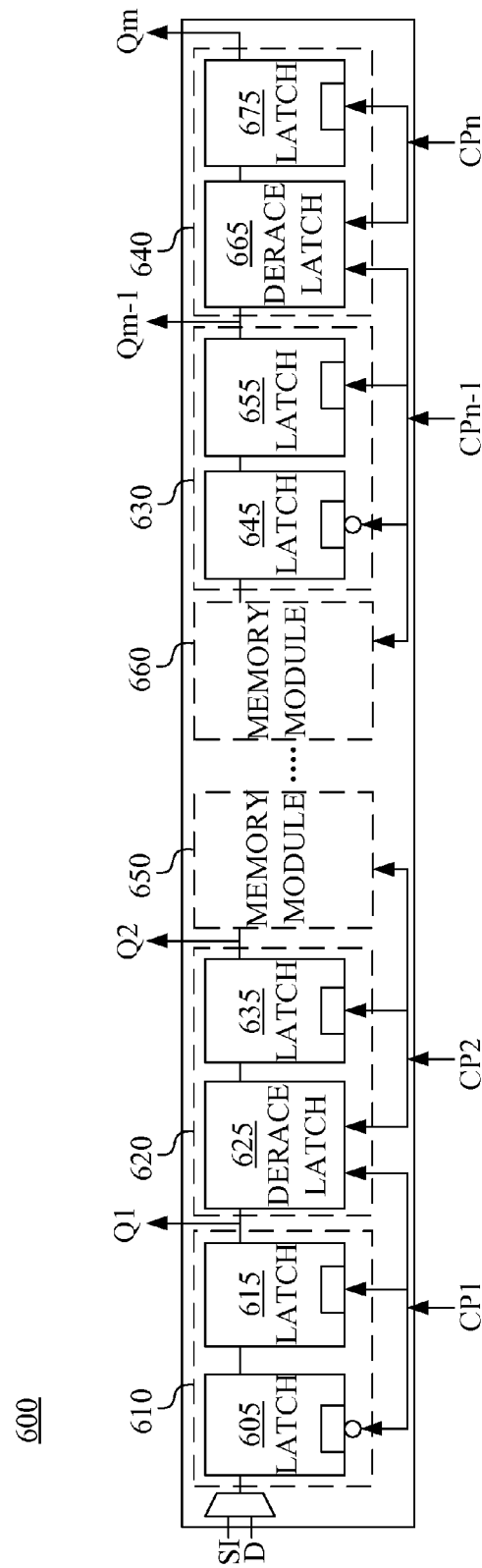
FIG. 6 is a block diagram of another memory device in accordance with various embodiments of the present disclosure.

FIG. 6 is a block diagram of another memory device 600 in accordance with various embodiments of the present disclosure. Compared to FIG. 1, the memory device 600 in FIG. 6 includes more than two memory modules, and these memory modules includes two memory modules that are similar to the memory module 110 and the memory module 120 in FIG. 1.

In some embodiments, the memory device 600 is a first-in-first-out (FIFO) device for transmitting a data signal D or a scan-in signal SI sequentially, and generates output data Q1-Qm. The memory device 600 includes memory modules 610-660. The number of memory modules illustrated in FIG. 6 is given for illustrative purposes. Various numbers of memory modules illustrated in FIG. 6 are within the contemplated scope of the present disclosure. For simplicity, two memory modules 650 and 660 are illustrated between the memory modules 630 and 640 in FIG. 6.

For illustration, the memory module 610 and the memory module 620 are connected together. The memory module 630 and the memory module 640 are connected together. In some embodiments, the memory modules 650 and 660 are connected between the memory module 620 and the memory module 630. For illustration, each of the memory modules 610-660 generates one of the output data Q1-Qm.

In some embodiments, the memory modules 610-660 are separated into a plurality of groups. Each group of the memory modules operates according to at least one corresponding control signal of the control signals CP1, CP2, . . . CPn−1 and CPn.

For illustration in FIG. 6, a group that includes the memory module 610 operates according to the control signal CP1. A group that includes the memory modules 620 and 650 operates according to the control signals CP1 and CP2. A group that includes the memory modules 660 and 630 operates according to the control signal CPn−1. A group that includes the memory module 640 operates according to the control signals CPn−1 and CPn.

The memory module 610 includes a latch 605 and a latch 615. The latch 605 and the latch 615 are configured to operate with the control signal CP1.

For illustration, the latch 605 and the latch 615 are connected in series. In operation, when the latch 605 receives the data signal D, the latch 605 holds the input data signal D according to the control signal CP1 having the first phase. Further, the latch 605 outputs the input data signal D according to the control signal CP1 having a second phase that is opposite to the first phase.

Moreover, with the operation of the latch 605, the latch 615 receives and holds the input data signal D from the latch 605 according to the control signal CP1 having the second phase. Further, the latch 615 outputs the input data signal D according to the control signal CP1 having the first phase.

The memory module 620 includes a derace latch 625 and a latch 635. The latch 635 is configured to operate with the control signal CP2. The derace latch 625 is configured to operate with the control signal CP1 and the control signal CP2.

In some embodiments, the derace latch 625 is identical to the derace latch 160 illustrated in FIG. 1. Accordingly, the operation of the derace latch 625 is similar to that of the derace latch 160 in FIG. 1. Alternatively stated, the derace latch 625 is enabled when both of the control signal CP1 and the control signal CP2 are in the second phase, and the derace latch 625 is disabled when either the control signal CP1 or the control signal CP2 is not in the second phase.

The latch 635 is configured to hold the data signal D transmitted from the derace latch 625 according to the control signal CP2 having the second phase. Further, the latch 635 is configured to output the data signal D according to the control signal CP2 having the first phase.

As a result, the transmission of the data signal D between the memory modules 610 and 620 are aligned due to the operation of the derace latch 625.

The memory module 630 includes a latch 645 and a latch 655. The latch 645 and the latch 655 are configured to operate with the control signal CPn−1.

For illustration, the latch 645 and the latch 655 are connected in series. In operation, when the latch 645 receives the data signal D, the latch 645 holds the input data signal D according to the control signal CPn−1 having the first phase. Further, the latch 645 outputs the input data signal D according to the control signal CPn−1 having the second phase.

Moreover, with the operation of the latch 645, the latch 655 receives and holds the input data signal D from the latch 645 according to the control signal CPn−1 having the second phase. Further, the latch 655 outputs the input data signal D according to the control signal CPn−1 having the first phase.

The memory module 640 includes a derace latch 665 and a latch 675. The latch 665 is configured to operate with the control signal CPn. The derace latch 665 is configured to operate with both of the control signal CPn−1 and the control signal CPn.

In some embodiments, the derace latch 665 is identical to the derace latch 160 illustrated in FIG. 1. Accordingly, the operation of the derace latch 665 is similar to that of the derace latch 160 in FIG. 1. Alternatively stated, the derace latch 665 is enabled when both of the control signal CPn−1 and the control signal CPn are in the second phase. When either the control signal CPn−1 or the control signal CPn is not in the second phase, the derace latch 625 is disabled.

The latch 675 is configured to hold a received data signal D transmitted from the derace latch 665 according to the control signal CPn having the second phase. Further, the latch 675 is configured to output the data signal D according to the control signal CPn having the first phase.

As a result, the transmission of the data signal D between the memory modules 630 and 640 are aligned due to the operation of the derace latch 665.

As described above, the memory device 600 includes a plurality of memory modules that correspond to a multiple of control signals. The transmission and reception of the data signal D between two groups of the memory modules are aligned by using the method identical to that applied in the memory device 100. Therefore, the alignment of the transmission and reception of the data signal D of the memory device 600 is able to be maintained.

The number of the memory modules and the corresponding control signals illustrated in FIG. 1 and FIG. 6 are given for illustrative purposes. Various numbers of the memory modules and the corresponding control signals are within the contemplated scope of the present disclosure.

The configurations of the derace latch illustrated in FIG. 2 and FIG. 3 are given for illustrative purposes. Various configurations of the derace latch are within the contemplated scope of the present disclosure.

In some embodiments, a device is disclosed that includes a first memory module and a second memory module. The first memory module is configured to output a data signal according to a first phase of a first control signal. The second memory module is connected to the first memory module and includes a latch and a derace latch. The latch is configured to hold a received data signal according to a second phase of a second control signal. The derace latch transmits the data signal from the first memory module to the latch according to the second phase of both of the first control signal and the second control signal.

Also disclosed is a device that includes a plurality of memory modules connected in series and having a first and a second groups of the memory modules corresponding to a first and a second control signals respectively. The first and the second groups of the memory modules include a first memory module and a second memory module. The first memory module is in the first group of memory modules and is configured to output a data signal according to a first phase of a first control signal. The second memory module is in the second group of memory modules, is connected to the first memory module and includes a latch and a derace latch. The latch is configured to hold a received data signal according to a second phase of a second control signal. The derace latch transmits the data signal from the first memory module to the latch according to the second phase of both of the first control signal and the second control signal.

Also disclosed is a method that includes the steps outlined below. A data signal is outputted by a first memory module according to a first phase of a first control signal. The data signal is transmitted by a derace latch of a second memory module connected to the first memory module, from the first memory module to a latch of the second memory module, according to the second phase of both of the first control signal and a second control signal. The data signal is held by the latch according to the second phase of the second control signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a first memory module configured to output a data signal according to a first phase of a first control signal; and
    a second memory module connected to the first memory module and comprising:
        a latch configured to hold a received data signal according to a second phase of a second control signal; and
        a derace latch configured to transmit the data signal from the first memory module to the latch according to the second phase of both of the first control signal and the second control signal.

2. The device of claim 1, wherein the first memory module comprises:
    a first latch configured to receive and hold an input data signal according to the first phase of the first control signal and output the input data signal according to the second phase of the first control signal; and
    a second latch configured to receive and hold the input data signal from the first latch according to the second phase of the first control signal and output the input data signal according to the first phase of the first control signal.

3. The device of claim 1, further comprising:
    a multiplexer connected to the first memory module, the multiplexer configured to transmit either the data signal or an input signal to the first memory module.

4. The device of claim 1, wherein the derace latch comprises:
    a first transmission gate connected to the first memory module and configured to be conducted according to the second phase of the first control signal;
    a second transmission gate connected to the first transmission gate in series and configured to be conducted according to the second phase of the second control signal;
    an inverter connected between the second transmission gate and the latch; and
    a keeper circuit connected between two ends of the inverter.

5. The device of claim 4, wherein when either the first control signal or the second control signal is not in the second phase, at least one of the first transmission gate and the second transmission gate is disabled and the keeper circuit holds the data signal corresponding to a previous cycle.

6. The device of claim 1, wherein the derace latch comprises:
    a tri-state inverter connected to the first memory module and configured to be conducted according to the second phase of both of the first control signal and the second control signal;
    an inverter connected between the tri-state inverter and the latch; and
    a keeper circuit connected between two ends of the inverter.

7. The device of claim 6, wherein when either the first control signal or the second control signal is not in the second phase, the tri-state inverter is disabled and the keeper circuit holds the data signal corresponding to a previous cycle.

8. A device, comprising:
a plurality of memory modules connected in series and having a first and a second groups of the memory modules corresponding to a first control signal and a second control signal, respectively, the plurality of memory modules comprising:
 a first memory module in the first group of memory modules and configured to output a data signal according to a first phase of a first control signal; and
 a second memory module in the second group of memory modules, the second memory module connected to the first memory module and comprising:
  a latch configured to hold a received data signal according to a second phase of a second control signal; and
  a derace latch to transmit the data signal from the first memory module to the latch according to the second phase of both of the first control signal and the second control signal.

9. The device of claim 8, wherein the first memory module comprises:
a first latch configured to receive and hold an input data signal according to the first phase of the first control signal and output the input data signal according to the second phase of the first control signal; and
a second latch configured to receive and hold the input data signal from the first-type latch according to the second phase of the first control signal and output the input data signal according to the first phase of the first control signal.

10. The device of claim 8, further comprising a multiplexer connected to an input of the first group of memory modules to transmit either the data signal or an input signal to the first group of memory modules.

11. The device of claim 8, wherein the derace latch comprises:
a first transmission gate connected to the first memory module and configured to be conducted according to the second phase of the first control signal;
a second transmission gate connected to the first transmission gate in series and configured to be conducted according to the second phase of the second control signal;
an inverter connected between the second transmission gate and the latch; and
a keeper circuit connected between two ends of the inverter.

12. The device of claim 11, wherein when either the first control signal or the second control signal is not in the second phase, at least one of the first transmission gate and the second transmission gate is disabled and the keeper circuit holds the data signal corresponding to a previous cycle.

13. The device of claim 8, wherein the derace latch comprises:
a tri-state inverter connected to the first memory module and configured to be conducted according to the second phase of both of the first control signal and the second control signal;
an inverter connected between the tri-state inverter and the latch; and
a keeper circuit connected between two ends of the inverter.

14. The device of claim 13, wherein when either the first control signal or the second control signal is not in the second phase, the tri-state inverter is disabled and the keeper circuit holds the data signal corresponding to a previous cycle.

15. A method, comprising:
outputting a data signal by a first memory module according to a first phase of a first control signal;
transmitting the data signal by a derace latch of a second memory module connected to the first memory module, from the first memory module to a latch of the second memory module, according to the second phase of both of the first control signal and a second control signal; and
holding the data signal by the latch according to the second phase of the second control signal.

16. The method of claim 15, wherein the first memory module comprises a first latch and a second latch, and the method further comprises:
receiving and holding an input data signal by the first latch according to the first phase of the first control signal and output the input data signal according to the second phase of the first control signal; and
receiving and holding the input data signal by the second latch from the first latch according to the second phase of the first control signal and output the input data signal according to the first phase of the first control signal.

17. The method of claim 15, wherein the derace latch comprises a first transmission gate, a second transmission gate, an inverter and a keeper circuit, wherein the method further comprises:
conducting the first transmission gate according to the second phase of the first control signal;
conducting the second transmission gate connected to the first transmission gate in series according to the second phase of the second control signal;
turning off the keeper circuit; and
transmitting the data signal from the first memory module through the first transmission gate, the second transmission gate and the inverter to the latch.

18. The method of claim 17, further comprising:
disabling at least one of the first transmission and the second transmission gate when either the first control signal or the second control signal is not in the second phase; and
holding the data signal corresponding to a previous cycle by the keeper circuit.

19. The method of claim 15, wherein the derace latch comprises a tri-state inverter, an inverter and a keeper circuit, wherein the method further comprises:
conducting the tri-state inverter according to the second phase of both of the first control signal and the second control signal; and
turning off the keeper circuit; and
transmitting the data signal from the first memory module through the first transmission gate, the second transmission gate and the inverter to the latch.

20. The device of claim 19, further comprising:
disabling the tri-state inverter when either the first control signal or the second control signal is not in the second phase; and
holding the data signal corresponding to a previous cycle by the keeper circuit.

* * * * *